(12) United States Patent
Song et al.

(10) Patent No.: US 7,095,298 B2
(45) Date of Patent: Aug. 22, 2006

(54) FILM BULK ACOUSTIC RESONATOR HAVING SUPPORTS AND MANUFACTURING METHOD THEREFORE

(75) Inventors: Il-jong Song, Suwon-si (KR); Duck-hwan Kim, Seoul (KR); In-sang Song, Seoul (KR); Yun-kwon Park, Dongdoocheon-si (KR); Byeoung-ju Ha, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 147 days.

(21) Appl. No.: 10/854,793

(22) Filed: May 27, 2004

(65) Prior Publication Data

US 2005/0012571 A1    Jan. 20, 2005

(30) Foreign Application Priority Data

May 29, 2003    (KR) ...................... 10-2003-0034540

(51) Int. Cl.
*H03H 9/54* (2006.01)
*H03H 3/02* (2006.01)

(52) U.S. Cl. ...................... 333/187; 333/189; 29/25.35
(58) Field of Classification Search ......... 333/187–192
See application file for complete search history.

(56) References Cited

U.S. PATENT DOCUMENTS

| 6,131,256 | A  | * | 10/2000 | Dydyk et al. ............. 29/25.35 |
| 6,472,610 | B1 |   | 10/2002 | Kawabata .................. 174/260 |
| 6,635,519 | B1 | * | 10/2003 | Barber et al. ............... 438/151 |
| 6,762,471 | B1 | * | 7/2004  | Kim ............................ 257/414 |
| 6,927,649 | B1 | * | 8/2005  | Metzger et al. ............. 333/133 |
| 2002/0109564 | A1 | * | 8/2002 | Tsai et al. ................... 333/187 |
| 2005/0184830 | A1 | * | 8/2005 | Ruby et al. ................. 333/189 |

FOREIGN PATENT DOCUMENTS

| JP | 02-274114 | 11/1990 |
| JP | 08-167825 | 6/1996 |
| JP | 11-145728 | 5/1999 |

OTHER PUBLICATIONS

Patent Abstracts of Japan, vol. 015, No. 36 (E-1027) Jan. 29, 1991.
Patent Abstracts of Japan, vol. 1996, No. 10, Oct. 31, 1996.
Patent Abstracsts of Japan, vol. 1999, No. 10, Aug. 31, 1999.

* cited by examiner

*Primary Examiner*—Barbara Summons
(74) *Attorney, Agent, or Firm*—Lee & Morse, P.C.

(57) ABSTRACT

A film bulk acoustic resonator (FBAR) has a support structure, a piezoelectric resonator, and a signal line that is electrically connected, e.g., through a via, to the piezoelectric resonator, all on a semiconductor substrate. Support(s) and/or the via mount the piezoelectric resonator at a predetermined distance from the semiconductor substrate, allowing an ideal shape of the resonator to be realized. The signal line may include a patterned inductor. A capacitor can be formed between the via and the signal line. The resonance characteristics can be enhanced since the substrate loss caused by the driving of the resonator can be prevented due to an air gap formed by the predetermined distance. The resonance frequency can be adjusted by altering the pattern of the inductor, the capacitance of the capacitor and/or the thickness of the piezoelectric layer, also allowing Impedance matching to be readily realized.

19 Claims, 6 Drawing Sheets

FILM BULK ACOUSTIC RESONATOR HAVING SUPPORTS AND MANUFACTURING METHOD THEREFORE

BACKGROUND OF THE INVENTION

1. Field of the Invention

The present invention relates to an acoustic resonator and a manufacturing method therefore, and more particularly to a film bulk acoustic resonator using a piezoelectric material and a manufacturing method therefore.

2. Description of the Related Art

Recently there have been dramatic developments in wireless mobile communication technologies. Such mobile communication technologies require diverse radio frequency (RF) parts that can efficiently transfer information in a limited frequency bandwidth. In particular, the filter of the RF parts is one of key element in mobile communication technologies. This filter serves to filter innumerable waves in air to allow users to select or transfer desired signals, thereby enabling high-quality communications.

Currently, wireless communication RF filters are typically dielectric filters or surface acoustic wave (SAW) filters. A dielectric filter provides high dielectric permittivity, low insertion loss, stability at high temperatures, and is robust to vibration and shock. However, the dielectric filter cannot be sufficiently reduced in size and cannot be integrated with other integrated circuits (ICs), including the recently developed Monolithic Microwave Integration Circuit (MMIC). In contrast, a SAW filter provides a small size, facilitates processing signals, has a simplified circuit, and can be manufactured in mass production in use of semiconductor processes.

Further, the SAW filter provides a high side rejection in a passband compared to the dielectric filter, allowing it to transmit and receive high-quality information. However, a SAW filter's line width for the InterDigital Transducer (IDT) is limited to about 0.5 µm since the process for creating the SAW filter includes a light exposure using ultraviolet (UV) rays. Accordingly, the SAW filter cannot cover the high frequency bands, e.g., over 5 GHz, and it is still difficult to construct the MMIC structure on a semiconductor substrate as a single chip.

In order to overcome the limits and problems as above, a film bulk acoustic resonance (FBAR) filter has been proposed in which a frequency control circuit can be completely constructed in the form of MMIC with other active devices integrated together on the existing Si or GaAs semiconductor substrate.

The FBAR is a thin film device that is low-priced, small-sized, and can be designed to have a high-Q. Thus, the FBAR filter can be used in wireless communication equipment of various frequency bands, for example, ranging from 900 MHz to 10 GHz and military radar. The FBAR can be made an order of magnitude smaller than a dielectric filter or a lumped constant (LC) filter and has a very low insertion loss compared to the SAW filter. The FBAR can be integrated with the MMIC while providing a filter having a high stability and a high-Q factor.

The FBAR filter includes a piezoelectric dielectric material such as ZnO, AlN, or the any appropriate material having a high acoustic velocity.

The piezoelectric material may be directly deposited onto a Si or GaAs semiconductor substrate, e.g., by RF sputtering. The resonance of the FBAR filter arises from the piezoelectric characteristics of the piezoelectric material used therein. More particularly, the FBAR filter includes a piezoelectric film disposed between two electrodes, and generates bulk acoustic waves to induce resonance.

FIG. 1 to FIG. 3 illustrate conventional FBAR structures. FIG. 1 illustrates a cross-section of a conventional membrane-based (or bulk micro-machining-based) FBAR. This membrane-based FBAR includes a silicon oxide layer ($SiO_2$) deposited on a substrate 11 forming a membrane layer 12 on the reverse side of the substrate 11 through a cavity 16 formed by isotropic etching. A resonator 17 includes a lower electrode layer 13 formed on the membrane layer 12, a piezoelectric layer 14 on the lower electrode layer 13, and an upper electrode layer 15 on the piezoelectric layer 14.

The above membrane-based FBAR provides a low dielectric loss of the substrate 11 and less power loss due to the cavity 16. However, the membrane-based FBAR occupies a large area due to the orientation of the silicon substrate, and is easily damaged due to the low structural stability upon a subsequent packaging process, resulting in low yield. Accordingly, recently, an air gap-type and Bragg reflector-based FBARs been created to reduce the loss due to the membrane and simplify the device manufacturing process.

FIG. 2 illustrates a cross-section of a Bragg reflector-based FBAR.

The Bragg reflector-based (or solidly mounted) FBAR includes an acoustic reflector 28 formed on a substrate 21 and a resonator 29 formed on the acoustic reflector 28. The acoustic reflector 28 typically includes a plurality of dielectric layers 22–24 alternating between low impedance and high impedance materials to insure efficient confinement of the acoustic energy in the resonator 29. The resonator 29 includes a lower electrode layer 25, a piezoelectric layer 26 and an upper electrode layer 27. Thus, such a Bragg reflector-based FBAR includes substances having large acoustic impedance difference therebetween disposed in multiple layers 22–24 on the substrate 21, which induce Bragg reflection to resonate due to acoustic waves between lower and upper electrode layers 25 and 27.

Accordingly, the Bragg reflector-based FBAR has a robust structure, does not cause stress due to the bending of the resonator 29, saves manufacturing time, and can withstand external impact. However, the Bragg reflector-based FBAR the thickness adjustments of the layers 22–24 for the total reflection are not easy and the manufacturing cost increases due to the formation of these reflection layers.

FIG. 3 illustrates a cross-section of an air gap-based (or surface micromachining-based) FBAR structure. The air gap-based FBAR has an air gap 36 formed through a sacrificial layer on a substrate 31 using micromachining technologies and has a membrane layer 32, e.g., a silicon oxide film. A resonator 37 is provided on top of the membrane layer 32.

The resonator 37 includes a lower electrode 33, a piezoelectric substance 34, and an upper electrode 35.

Compared with the membrane-based FBAR of FIG. 1, the air gap-based FBAR reduces processing time, eliminates the possible danger due to a hazardous gas used in this etching, has a lower substrate dielectric loss, and occupies a smaller area. However, the manufacturing yield of the air gap-based FBAR is reduced since the structure is easily damaged due to exposing the structure for a long time while the sacrificial layer is removed.

Further, the manufacturing process of the air gap-based FBAR is complicated.

SUMMARY

The present invention is therefore directed to a film bulk acoustic resonator (FBAR) and a manufacturing method thereof, which substantially overcome one or more of the problems due to the limitations and disadvantages of the related art.

It is a feature of the present invention to provide a FBAR and a manufacturing method therefore having improved resonance characteristics. It is another feature of the present invention to provide a FBAR and a manufacturing method therefore manufactured simply and with a high yield. It is a yet another feature of the present invention to provide a FBAR and a manufacturing method therefore having a lower substrate dielectric loss.

At least one of the above and other features may be realized by providing a FBAR, including a semiconductor substrate, a signal line formed on an upper surface of the semiconductor substrate, a piezoelectric resonance structure, and at least one support that mounts the piezoelectric resonance structure above the upper surface of the semiconductor substrate at a predetermined height. The piezoelectric resonance structure includes a lower electrode, an upper electrode, and a piezoelectric film between the lower and upper electrodes, and is electrically connected to the signal line.

The FBAR may include a via that supports the piezoelectric resonance structure and electrically connects the signal line and the lower electrode of the piezoelectric resonance structure.

The FBAR may include a capacitor formed on a portion of an upper surface of the signal line. The capacitor may include lower conductive film, a dielectric material, and an upper conductive film, the dielectric material being between the lower and upper conductive films, the via connecting the lower electrode of the piezoelectric resonance structure and the capacitor. The lower conductive film may be the signal line.

The FBAR may include a via that electrically connects the lower electrode of the piezoelectric resonance structure and the capacitor. The capacitor may be in the middle of the via between the lower electrode of the piezoelectric resonance structure and the signal line. The signal line may include a patterned inductor, with or without the conductor.

The signal line may include a plurality of lines and the piezoelectric resonance structure may include a plurality of resonators, each resonator corresponding to one line of the plurality of lines. Each resonator may include a piezoelectric layer separated by a conductive portion connecting an upper electrode of the resonator to a lower electrode of an adjacent resonator. An upper electrode and a piezoelectric layer may be continuous across the plurality of resonators and each resonator may have a unique lower electrode.

At least one of the above and other features may be realized by providing a method for manufacturing a FBAR including: depositing a conductive film on an upper surface of a semiconductor substrate, patterning the conductive film to form a signal line, depositing a sacrificial layer on the signal line formed on the semiconductor substrate, forming a first through hole from an upper surface of the sacrificial layer to the signal line, forming at least one second through hole from the upper surface of the sacrificial layer to the semiconductor substrate, filling the first through hole with a conductive material to form a via, filling the at least one second through holes with an insulation material to form a support, depositing a first conductive film on the upper surface of the sacrificial layer to form a first electrode, depositing a piezoelectric film on an upper surface of the first electrode, depositing a second conductive film on an upper surface of the piezoelectric film to form a second electrode, and removing the sacrificial layer.

The method may include depositing a dielectric film on the signal line formed on the upper surface of the semiconductor substrate, depositing a third conductive film on an upper surface of the dielectric film, and removing the dielectric film and the third conductive film except for a region corresponding to a portion of the signal line to form a capacitor, the first through hole communicating with the third conductive film.

The method may include patterning the signal line to form an inductor. The method as may use more than one sacrificial layer is used and may include depositing a first sacrificial layer on the upper surface of the signal line, forming a third through hole communicating from an upper surface of the first sacrificial layer to the signal line, filling the third through hole with a conductive material to form a lower portion of the via, depositing a third conductive film, a dielectric film, and a fourth conductive film in order on the upper surface of the first sacrificial layer in which the lower portion of the via is formed, and removing a remaining region except for a portion including the lower portion of the via filled in the third through hole to form a capacitor, wherein an upper portion of the via is formed from the filling of the first through hole.

The method may include selecting the capacitance of the capacitor and/or the patterning of the inductor to determine the resonance frequency of the film bulk acoustic resonator FBAR.

The depositing of the first conductive film to form the first electrode may include depositing a plurality of separate first conductive films to form a plurality of resonators. The depositing of the piezoelectric film may include depositing a plurality of piezoelectric films, the depositing of the second conductive film to form the second electrode includes depositing a plurality of separate second conductive films to form a plurality of resonators, the method further including providing conductive portions between adjacent ones of the plurality of piezoelectric films to connect a first electrode of one of the plurality of resonators to a second electrode to an adjacent resonator.

At least one of the above and other features of the present invention may be realized by providing a FBAR including a semiconductor substrate, a signal line formed on the semiconductor substrate, a piezoelectric resonance structure including a lower electrode, an upper electrode, and a piezoelectric film between the lower and upper electrodes, and a via that supports the piezoelectric resonance structure above the upper surface of the semiconductor substrate at a predetermined height and electrically connects the signal line and the lower electrode of the piezoelectric resonance structure.

As aforementioned, the film bulk acoustic resonator and the manufacturing method therefore can reduce the substrate dielectric loss due to the resonance structure being spaced at a predetermined distance from the substrate. Further, impedance matching with external circuits can be easily realized. Finally, the integration with other devices can be improved, since passive and active devices, such as an inductor and/or a capacitor, can be integrated in the space between the substrate and the resonance structure.

BRIEF DESCRIPTION OF THE DRAWINGS

The above aspect and other features of the present invention will become more apparent by describing, in detail, illustrative, non-limiting embodiments thereof with reference to the attached drawings, in which.

DETAILED DESCRIPTION

Figure 1:
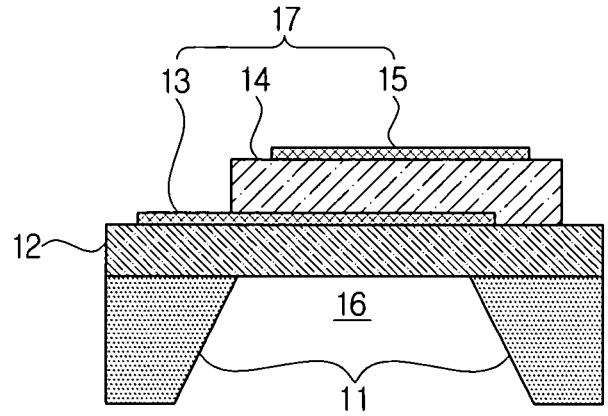
FIG. 1 illustrates a cross-section of a conventional membrane-based FBAR.
Figure 2:
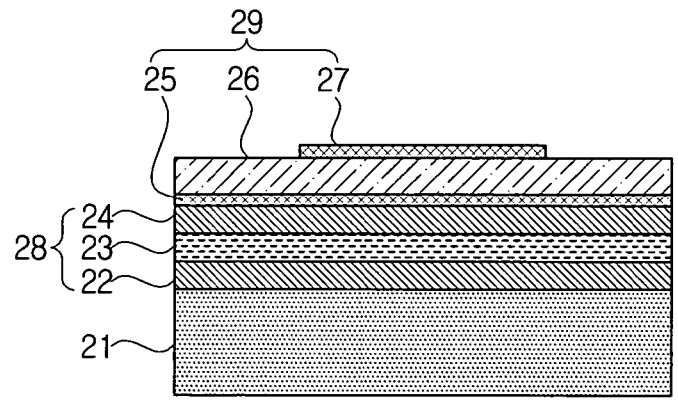
FIG. 2 illustrates a cross-section of a conventional Bragg reflector-based FBAR.
Figure 3:
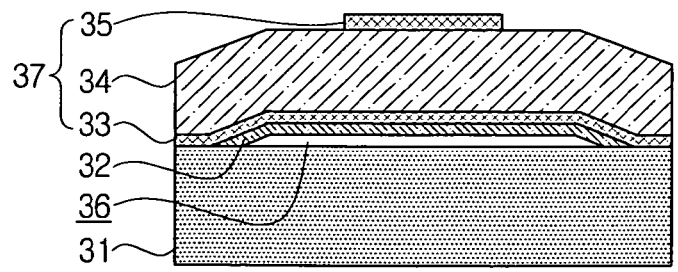
FIG. 3 illustrates a cross-section of a conventional air gap FBAR.

Korean Patent Application No. 2003-34540, filed on May 29, 2003, in the Korean Intellectual Property Office, and entitled "FILM BULK ACOUSTIC RESONATOR HAVING SUPPORTS AND MANUFACTURING METHOD THEREFOR," is incorporated herein by reference in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it may be directly on the other layer or substrate, or intervening layers may also be present. Further, it will be understood that when a layer is referred to as being "under" another layer, it may be directly under, or one or more intervening layers may also be present. In addition, it will also be understood that when a layer is referred to as being "between" two layers, it may be the only layer between the two layers, or one or more intervening layers may also be present. Like numbers refer to like elements throughout.

Figure 4A:
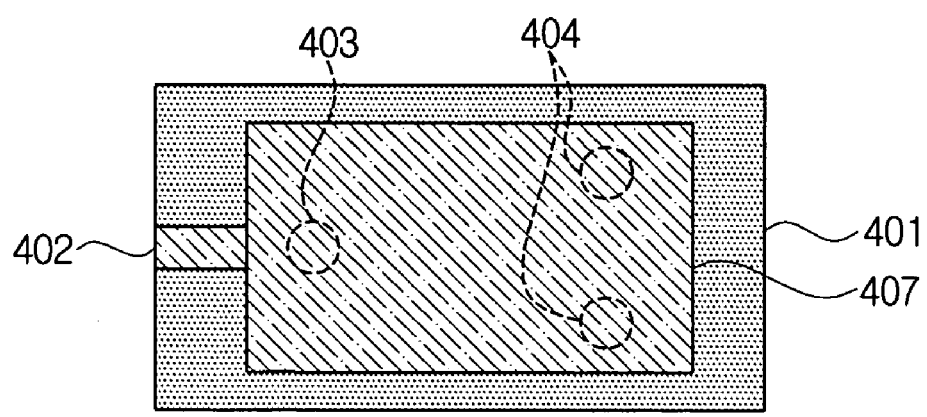
FIG. 4A and FIG. 4B respectively illustrate plan and cross-sectional views of an FBAR according to an embodiment of the present invention.
Figure 4B:
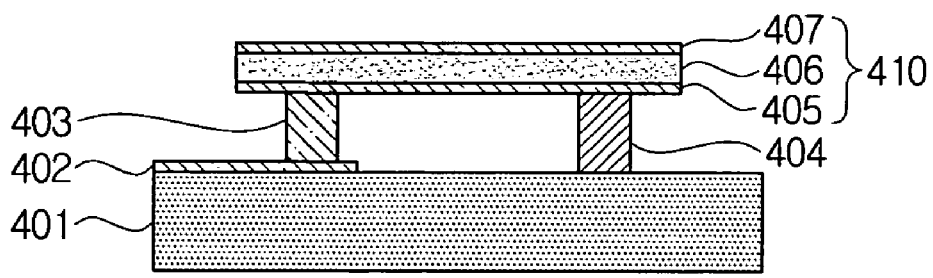

FIG. 4A and FIG. 4B respectively illustrate plan and cross-sectional views of an FBAR according to an embodiment of the present invention. The FBAR has a signal line 402 formed on an upper surface of a substrate 401, a resonance structure 410, two supports 404 and a via 403. The resonant structure 410 includes a lower electrode 405, a piezoelectric material 406 on the lower electrode 405, and an upper electrode 407 on the piezoelectric material 406. The two supports 404 and the via 403 space the resonant structure 410 from the substrate 401 at a predetermined distance. The via 403 electrically connects the lower electrode 405 of the resonator 410 and the signal line 402 formed on the substrate 401.

Figure 9A:
FIG. 9A to FIG. 9G illustrate cross-sections of various stages of a process for manufacturing the FBAR shown in FIG. 4A and FIG. 4B.
Figure 9B:
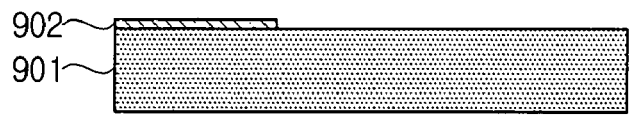
Figure 9C:
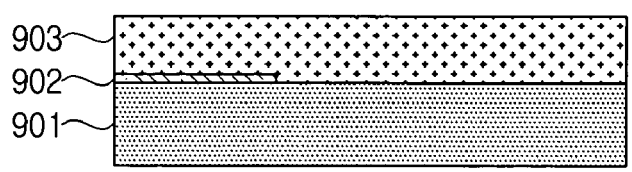
Figure 9D:
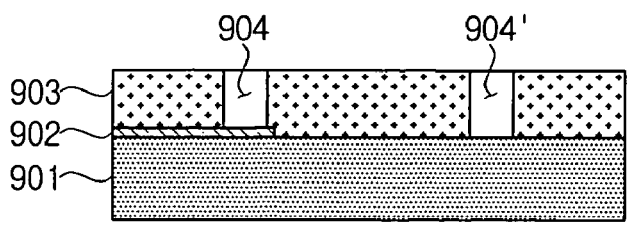
Figure 9E:
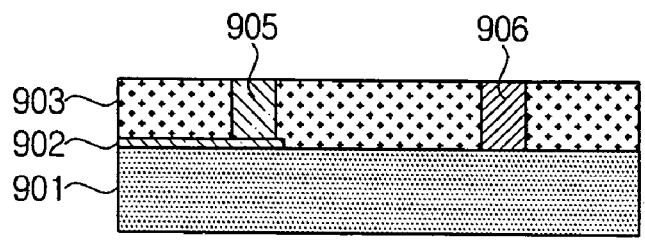
Figure 9F:
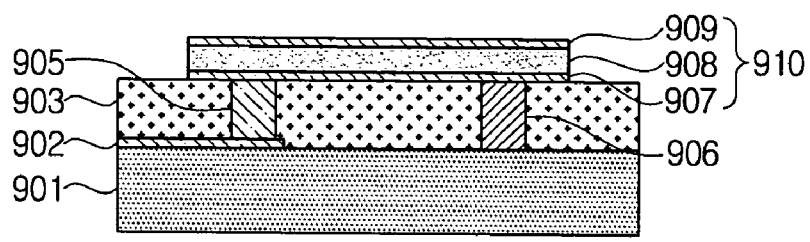
Figure 9G:
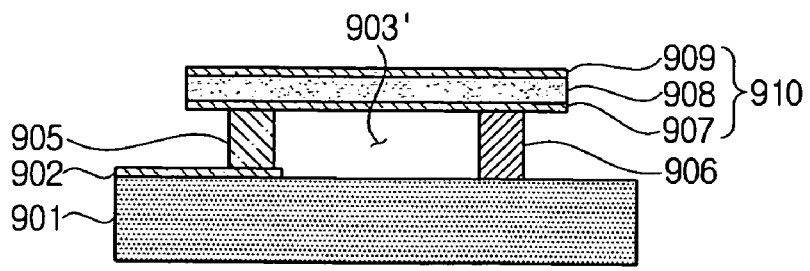

FIG. 9A to FIG. 9G illustrate steps of a manufacturing process for the FBAR shown in FIG. 4A and FIG. 4B. A signal line 902 is first formed as shown in FIG. 9B on the upper surface of the substrate 901 shown in FIG. 9A. As shown in FIG. 9C, a sacrificial layer 903 is deposited on the upper surface of the substrate 901 on which the signal line 902 is formed. The sacrificial layer 903 may be photoresist or any material that may readily patterned and subsequently removed without harming the remaining structure. Thereafter, patterning is performed on the upper surface of the sacrificial layer 903 for positions at which the supports and via are to be. Portions of the sacrificial layer 903 are removed in accordance with the pattering to form through holes 904 and 904' shown in FIG. 9D. At this time, the through hole 904 for the via communicates with the signal line 902, and the through hole 904' for the supports communicates with the upper surface of the substrate 901. Next, as shown in FIG. 9E, a conductive material 905, e.g., metal, fills the through hole 904 for the via. An insulation material 906 fills the through hole 904' for the supports. Thereafter, a flattening process is carried out on the upper surface of the sacrificial layer having the through holes 904 and 904' filled with the materials 905 and 906 respectively. As shown in FIG. 9F, a conductive film, e.g., metal, for the lower electrode 907, a piezoelectric material 908, and a conductive film, e.g., metal, for the upper electrode 909 are provided in order to form a resonator 910. Next, in FIG. 9G, the sacrificial layer 903 is removed.

Through the above manufacturing processes, the FBAR having the resonator 910 suspended at a predetermined height above the substrate is created. The substrate loss caused by the driving of the resonator 910 can be reduced due to an air gap 903' formed between the substrate 901 and the resonator 910.

In the meantime, in the manufacturing process, the through hole 904' for the supports is not necessarily limited to communicate with the upper surface of the substrate 901, but may be formed at positions where the resonator 910 can be supported most stably. When the supports 906 are made of insulating material, they will not electrically short-circuit the lower electrode 907 and the signal line 902 even if they are connected to the signal line 902.

Figure 5:
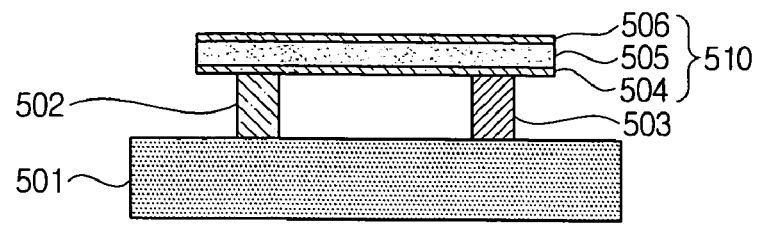
FIG. 5 to FIG. 8 respectively illustrate cross-sections of FBARs according to other embodiments of the present invention.

FIG. 5 illustrates a cross-section of an FBAR according to another embodiment of the present invention. As before, the FBAR includes a substrate 501 and a resonant structure 510 mounted above the substrate 501. The resonant structure 510 includes a lower electrode 504, a piezoelectric layer 505 and an upper electrode 506. At least one support 503 supports the resonant structure 510 at a predetermined height above the substrate 501. In contrast to the previous embodiment, the FBAR shown in FIG. 5 has a stub 502 connecting the lower electrode 504 to the ground (not shown) rather than the via 403 and line 402 of FIG. 4.

Figure 6:
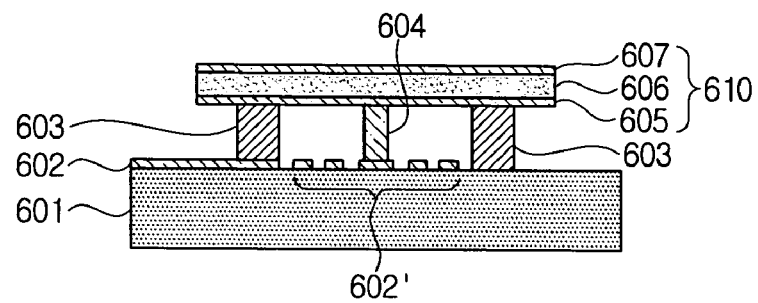

FIG. 6 illustrates cross-section of an FBAR according to yet another embodiment of the present invention. Similar to the previous embodiments, the FBAR has a resonant structure 610 mounted above the substrate 601. The resonant structure 610 includes a lower electrode 605, a piezoelectric layer 606 and an upper electrode 607. In the FBAR shown in FIG. 6, a signal line 602 includes an inductor pattern 602' formed on the upper surface of the semiconductor substrate 601. Supports 603 supporting the resonator 610 above the substrate 601 are provided on the both sides of the inductor pattern 601'. Further, a via 604 connects the lower electrode 605 of the resonant structure 610 to the inductor pattern 602'. Thus, a resonance frequency of the FBAR shown in FIG. 6 can be adjusted using the inductor pattern 602' and can easily match the impedance of external circuits.

Figure 7:
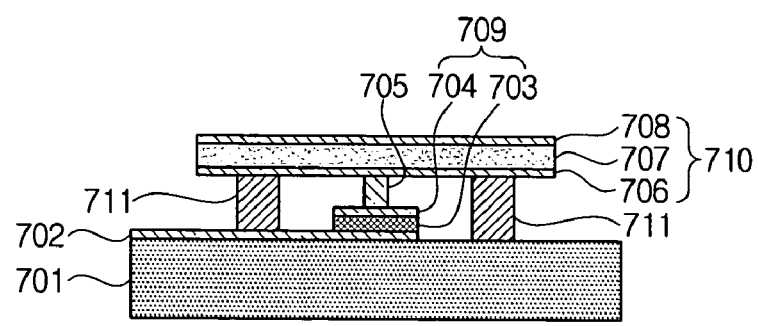

FIG. 7 illustrates a cross-section of an FBAR according to still another embodiment of the present invention. Again, the FBAR includes a resonant structure 710 mounted above a substrate 701. The resonant structure 710 includes a lower electrode 706, a piezoelectric material 707 and an upper electrode 708. Supports 711 mount the resonant structure 710 at a predetermined height above the substrate 701. As shown in FIG. 7, the FBAR also includes a capacitor 709 formed from a dielectric material 703 and a conductive film 704, disposed in that order, on a signal line 702. A via 705 connects the lower electrode 706 of the resonator 710 and the capacitor 709. Such an FBAR can adjust the resonance frequency depending upon the capacitance of the capacitor 709 rather than changing the resonance frequency depending upon the thickness of the piezoelectric layer 707 of the resonant structure 710, and can easily match the impedance of external circuits.

In order to manufacture the FBAR having the capacitor 709, the dielectric film 703 is deposited on the signal line 702 formed on the upper surface of the semiconductor substrate 701, and then the conductive film 704 is deposited on the upper surface of the dielectric film 703. Next, the dielectric film 703 and the conductive film 704 are removed except in an area corresponding to a portion of the signal line 702, so that the via 705 can be formed. However, the manufacture of the FBAR having the capacitor is not limited to the process as above, but can be done through many different processes. For example, the dielectric film and the conductive film may be deposited only in an area in which the capacitor is to be formed, e.g., by using a sacrificial layer.

Figure 8:
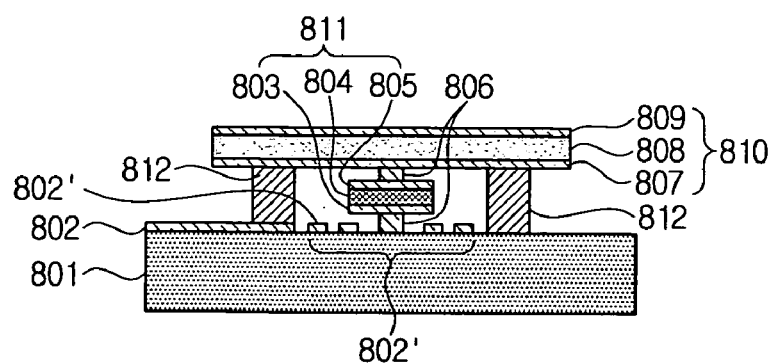

FIG. 8 illustrates a cross-section of an FBAR according to further another embodiment of the present invention. Again, the FBAR includes a resonant structure 810 mounted above a substrate 801. The resonant structure 810 includes a lower electrode 807, a piezoelectric material 808 and an upper electrode 809. Supports 812 mount the resonant structure 810 at a predetermined height above the substrate 801. As shown in FIG. 8, the FBAR includes both an inductor pattern 802' and a capacitor 811. The inductor pattern 802' is formed on the signal line 802, and the capacitor 811 is formed in the middle of a via 806 connecting the lower electrode 807 to the signal line 802. Here, since the capacitor 811 provided above the signal line 802, the capacitor no longer uses the signal line 802 as a lower conductive portion thereof, as does the capacitor 709 in FIG. 7. Instead, the capacitor 811 of FIG. 8 includes a first conductive layer 803, a dielectric layer 804 and a second conductive layer 805.

In order to manufacture the FBAR having both the inductor 802' and the capacitor 811, first, a first sacrificial layer is deposited on the upper surface of the signal line 802, a through hole is formed from the upper surface of the first sacrificial layer to communicate with the signal line, and a conductive material is filled in the through hole to form the lower portion of the via 806. Then, the conductive layer 803, dielectric layer 804 and conductive layer 805 are deposited in that order on the upper surface of the first sacrificial layer in which the lower portion of the via 806 is formed. These layers 803–805 are then removed except for a region including the lower portion of the via 806 to form the capacitor 811. Then, a second sacrificial layer is deposited on the upper surface of the first sacrificial layer in which the capacitor 811 is formed, and the upper portion of the via 806 is formed to contact the upper conductive film of the capacitor 811. Through holes for the supports 812 are formed through the first and second sacrificial layers and are filled with an insulating material. Next, the resonator 810 is deposited on the second sacrificial layer so that the FBAR is completely manufactured. However, the manufacture of the FBAR including both the inductor and the capacitor as above is not limited to the above process, but can be done through numerous different processes.

Figure 10:
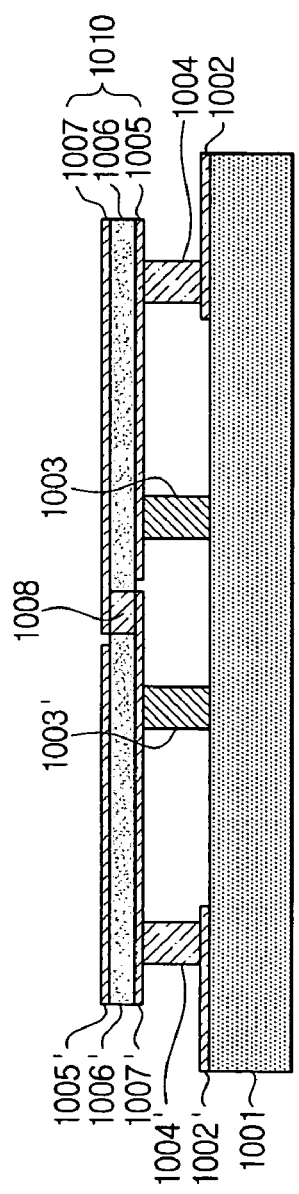
FIG. 10 and FIG. 11 illustrate cross-sections of filters incorporating FBARs according to the present invention.
Figure 11:
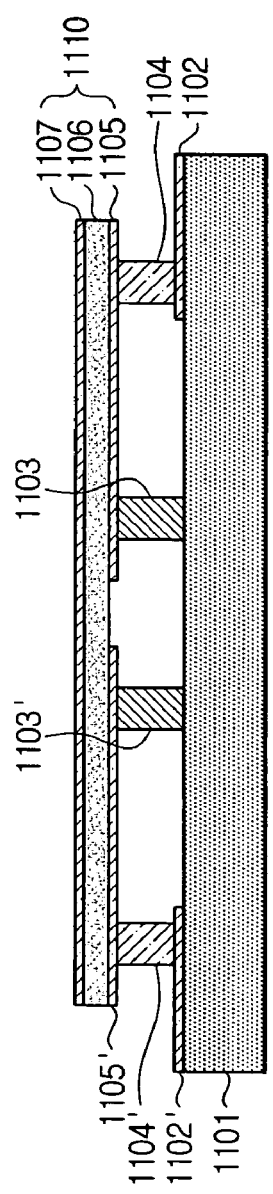

FIG. 10 and FIG. 11 illustrate cross-sections of filters incorporating the FBARs of to the present invention. FIG. 10 includes a semiconductor substrate 1001, supports 1003, 1003', vias 1004, 1004', and a resonator structure 1010. The resonator structure 1010 includes lower electrodes 1005, 1007', piezoelectric materials 1006, 1006' and upper electrodes 1007', 1005'. In FIG. 10, the resonator structure 1010 includes a plurality of resonators, here shown as two resonators, separated by a conductive portion 1008 connecting lower electrode 1007' and upper electrode 1007. Each resonator is connected to a corresponding signal line 1002, 1002' through a corresponding via 1003, 1003'.

FIG. 11 includes a semiconductor substrate 1101, supports 1103, 1103', vias 1104, 1104', and a resonator structure 1110. The resonator structure 1110 includes lower electrodes 1105, 1005', a continuous piezoelectric material 1106 and a continuous upper electrode 1107. In FIG. 11, the resonator structure 1110 includes a plurality of resonators, here shown as two resonators, defined by the gap between the lower electrodes 1105, 1105'. Each resonator is connected to a corresponding signal line 1102, 1102' through a corresponding via 1103, 1103'.

While only two resonators are shown in the illustrative filters of FIG. 10 and FIG. 11, any desired one- or two-dimensional arrays of such resonators may be readily formed. Further, any of the configurations of FBAR disclosed above may be used in conjunction with FIGS. 10 and 11.

In the above FBARs according to the present invention, an ideal shape for a resonator can be obtained since an air gap is formed between a piezoelectric resonance structure and the substrate through the supports, and the resonance characteristics can be improved since the substrate loss can be reduced.

Further, the resonance frequency can be adjusted by using an inductor and/or a capacitor rather than by altering the thickness of the piezoelectric layer, and the impedance matching is easily performed with external circuits.

Further, passive and active devices can be formed on the substrate separately from the FBAR, so that the substrate efficiency can be enhanced as well as the process efficiency can be enhanced with compatible integrated circuit manufacturing techniques, such as CMOS processes.

Embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A film bulk acoustic resonator, comprising:

a semiconductor substrate;

a signal line formed on an upper surface of the semiconductor substrate;

a piezoelectric resonance structure including a lower electrode, an upper electrode, and a piezoelectric film between the lower and upper electrodes, the piezoelectric resonance structure being electrically connected to the signal line;

at least one support that mounts the piezoelectric resonance structure above the upper surface of the semiconductor substrate at a predetermined height; and a via that supports the piezoelectric resonance structure and electrically connects the signal line and the lower electrode of the piezoelectric resonance structure.

2. The film bulk acoustic resonator as claimed in claim 1, further comprising a capacitor formed on a portion of an upper surface of the signal line, the capacitor including a dielectric material and a conductive film on an upper surface of the dielectric substance, the via connecting the lower electrode of the piezoelectric resonance structure and the capacitor.

3. The film bulk acoustic resonator as claimed in claim 1, wherein the signal line includes an inductor.

4. The film bulk acoustic resonator as claimed in claim 3, further comprising a capacitor including a lower conductive film, a dielectric material, and an upper conductive film, the lower conductive film corresponding to a portion of the signal line and being electrically connected to the signal line with the via.

5. The film bulk acoustic resonator as claimed in claim 4, further comprising a via that electrically connects the lower electrode of the piezoelectric resonance structure and the capacitor.

6. The film bulk acoustic resonator as claimed in claim 5, wherein the capacitor is in the middle of the via between the lower electrode of the piezoelectric resonance structure and the signal line.

7. The film bulk acoustic resonator as claimed in claim 1, wherein the signal line includes a plurality of lines and the piezoelectric resonance structure includes a plurality of resonators, each resonator corresponding to one line of the plurality of lines.

8. The film bulk acoustic resonator as claimed in claim 7, wherein each resonator includes a piezoelectric layer separated by a conductive portion connecting an upper electrode of the resonator to a lower electrode of an adjacent resonator.

9. The film bulk acoustic resonator as claimed in claim 7, wherein an upper electrode and a piezoelectric layer are continuous across the plurality of resonators and each resonator has a unique lower electrode.

10. A method for manufacturing a film bulk acoustic resonator, the method comprising:
depositing a conductive film on an upper surface of a semiconductor substrate;
patterning the conductive film to form a signal line;
depositing a sacrificial layer on the signal line formed on the semiconductor substrate;
forming a first through hole from an upper surface of the sacrificial layer to the signal line;
forming at least one second through hole from the upper surface of the sacrificial layer to the semiconductor substrate;
filling the first through hole with a conductive material to form a via;
filling the at least one second through holes with an insulation material to form a support;
depositing a first conductive film on the upper surface of the sacrificial layer to form a first electrode;
depositing a piezoelectric film on an upper surface of the first electrode;
depositing a second conductive film on an upper surface of the piezoelectric film to form a second electrode; and
removing the sacrificial layer.

11. The method as claimed in claim 10, further comprising:
depositing a dielectric film on the signal line formed on the upper surface of the semiconductor substrate;
depositing a third conductive film on an upper surface of the dielectric film; and
removing the dielectric film and the third conductive film except for a region corresponding to a portion of the signal line to form a capacitor, the first through hole communicating with the third conductive film.

12. The method as claimed in claim 11, further comprising selecting a capacitance of the capacitor to determine the resonance frequency of the film bulk acoustic resonator.

13. The method as claimed in claim 10, further comprising patterning the signal line to form an inductor.

14. The method as claimed in claim 13, wherein more than one sacrificial layer is used, the method further comprising:
depositing a first sacrificial layer on the upper surface of the signal line;
forming a third through hole communicating from an upper surface of the first sacrificial layer to the signal line;
filling the third through hole with a conductive material to form a lower portion of the via;
depositing a third conductive film, a dielectric film, and a fourth conductive film in order on the upper surface of the first sacrificial layer in which the lower portion of the via is formed; and
removing a remaining region except for a portion including the lower portion of the via filled in the third through hole to form a capacitor, wherein an upper portion of the via is formed from the filling of the first through hole.

15. The method as claimed in claim 13, further comprising selecting the patterning of the inductor to determine the resonance frequency of the film bulk acoustic resonator.

16. The method as claimed in claim 10, wherein the depositing of the first conductive film to form the first electrode includes depositing a plurality of separate first conductive films to form a plurality of resonators.

17. The method as claimed in claim 16, wherein the depositing of the piezoelectric film includes depositing a plurality of piezoelectric films, the depositing of the second conductive film to form the second electrode includes depositing a plurality of separate second conductive films to form a plurality of resonators, the method further including providing conductive portions between adjacent ones of the plurality of piezoelectric films to connect a first electrode of one of the plurality of resonators to a second electrode of an adjacent resonator.

18. A film bulk acoustic resonator, comprising:
a semiconductor substrate;
a signal line formed on the semiconductor substrate;
a piezoelectric resonance structure including a lower electrode, an upper electrode, and a piezoelectric film between the lower and upper electrodes; and
a via that supports the piezoelectric resonance structure above the upper surface of the semiconductor substrate at a predetermined height and electrically connects the signal line and the lower electrode of the piezoelectric resonance structure.

19. The film bulk acoustic resonator as claimed in claim 18, wherein the signal line includes a plurality of lines, the piezoelectric resonance structure includes a plurality of resonators and the via includes a plurality of vias, each via electrically connecting a corresponding piezoelectric resonance structure to a corresponding line.

* * * * *